United States Patent [19]

Lim

[11] Patent Number: 5,206,536
[45] Date of Patent: Apr. 27, 1993

[54] COMB INSERT FOR SEMICONDUCTOR PACKAGED DEVICES

[75] Inventor: Thiam B. Lim, Singapore, Singapore

[73] Assignee: Texas Instruments, Incorporated, Dallas, Tex.

[21] Appl. No.: 644,805

[22] Filed: Jan. 23, 1991

[51] Int. Cl.⁵ .................................................. H01L 23/48
[52] U.S. Cl. .................................. 257/668; 257/736; 257/776; 257/787
[58] Field of Search .............................. 357/68, 70, 72

[56] References Cited

U.S. PATENT DOCUMENTS

| 4,862,245 | 8/1989 | Pashby et al. | 357/70 |
| 4,916,519 | 4/1990 | Ward | 357/70 |
| 5,025,114 | 6/1991 | Braden | 357/70 |

Primary Examiner—Edward J. Wojciechowicz
Attorney, Agent, or Firm—Rose K. Castro; Leo N. Heiting; Richard L. Donaldson

[57] ABSTRACT

A comb insert for semiconductor packaged devices is disclosed. The comb is conductive and thus useful to function as a power supply bus in transferring power to the semiconductor die. A base, formed out of a conductive material, resides underneath the lead fingers of the semiconductor packaged device, electrically isolated from the lead fingers. The base has teeth extending from it, also formed out of the conductive material, that reside between the lead fingers of the semiconductor packaged device. Some of the teeth are electrically connected to the lead fingers for receiving external power. Some of the teeth are electrically connected to the bonding pads of the semiconductor die. Power is transferred from the lead fingers for receiving it, through the teeth electrically connected to these lead fingers, through the base, through the teeth electrically connected to the bonding pads, and to the semiconductor die. Utilizing the comb insert in a lead on chip lead frame semiconductor packaged device solves the problem of wire bond shorting to the power supply bus portions of the lead frame.

15 Claims, 6 Drawing Sheets

1

COMB INSERT FOR SEMICONDUCTOR PACKAGED DEVICES

FIELD OF THE INVENTION

This invention relates to integrated circuits, and more particularly relates to integrated circuit packages.

BACKGROUND OF THE INVENTION

An integrated circuit packaged device generally includes an integrated circuit chip lying on a chip support pad. Wire bonds connect the IC to a lead frame. A substance, such as plastic, encapsulates the structure. The plastic small outline J lead (PSOJ) package is one exemplary example. For application, one technique uses reflow solder to surface mount the IC package to a printed circuit board.

As the industry moves towards thinner packages and packages containing chips of larger size for higher volumetric packaging, new packaging techniques are evolving. One such technique is the lead on chip package, (LOC). As described in U.S. Pat. No. 4,862,245 to Pashby et al., issued Aug. 29, 1989, and in U.S. Pat. No. 4,916,519 to Ward, issued Apr. 10, 1990, and in the article entitled *Volume Production of Unique Plastic Surface Mount Modules For The IBM 80-ns 1-Mbit DRAM Chip by Area Wire Bond Techniques* by William C. Ward, published at the 38th ECC in IEEE 1988, pages 552–557, this technique disposes a lead frame over the active area of an integrated circuit. Adhesive insulating tape attaches the lead frame to the integrated circuit chip. Wire bonds connect the circuit to the centrally disposed power supply busses. And, wire bonds jump over the power supply busses to connect the integrated circuit to conductive lead fingers. No chip support pad is required.

Concerns exist about potential wire bond shorting to the power bus portions of the lead frame in the LOC package. Since the wires to the signal pins cross the metal lead frame power bus, the opportunity for shorting may arise from assembly processes such as poor bond location, wire loop control, mold compound sweep, or from accidental touching during processing. These assembly process also create concerns about shorting between the wirebonds themselves.

One approach to minimize shorting problems suggests the use insulated wire. See, *Insulated Aluminum Bonding Wire For High Lead Count Packaging* by Alex J. Oto, International Journal For Hybrid Microelectronics, Vol. 9, No. 1, 1986. While insulated wire has been reported to have some degree of success in conventional assembly packages, the successful implementation in a LOC package is questionable due to the nature of the wire bond stitch as it occurs over the insulating film on top of the integrated circuit; the probability of successful implementation is therefore less likely. Additionally, insulated wire is expensive.

It is an object of this invention to provide a solution to wire bond shorting in lead on chip integrated circuit packaged devices.

Other objects and benefits of this invention will be apparent to those of ordinary skill in the art having the benefit of the description to follow herein.

SUMMARY OF THE INVENTION

A comb insert for semiconductor packaged devices is disclosed. The comb is conductive and thus useful to function as a power supply bus in transferring power to the semiconductor die. A base, formed out of a conductive material, resides underneath the lead fingers of the semiconductor packaged device, electrically isolated from the lead fingers. The base has teeth extending from it, also formed out of the conductive material, that reside between the lead fingers of the semiconductor packaged device. Some of the teeth are electrically connected to the lead fingers for receiving external power. Some of the teeth are electrically connected to the bonding pads of the semiconductor die. Power is transferred from the lead fingers for receiving it, through the teeth electrically connected to these lead fingers, through the base, through the teeth electrically connected to the bonding pads, and to the semiconductor die. Utilizing the comb insert in a lead on chip lead frame semiconductor packaged device solves the problem of wire bond shorting to the power supply bus portions of the lead frame.

DETAILED DESCRIPTION OF SPECIFIC EMBODIMENT

Figure 1:
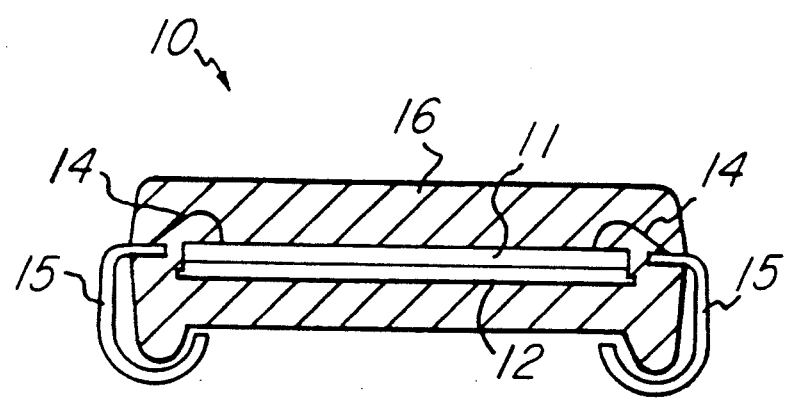
FIG. 1 is a cross section view of a typical integrated circuit package.

FIG. 1 illustrates an integrated circuit packaged device 10 constructed in the industry standard plastic small outline J-leaded (PSOJ) surface mount package. A semiconductor integrated circuit chip 11 rests on a mount support pad (chip attach) 12. Wire bonds 14 connect the bonding pads (not shown) located along the outer edges of semiconductor circuit 11 to conductive "J" shaped lead fingers 15. A mold compound material 16 such as plastic encapsulates the components.

Figure 2:
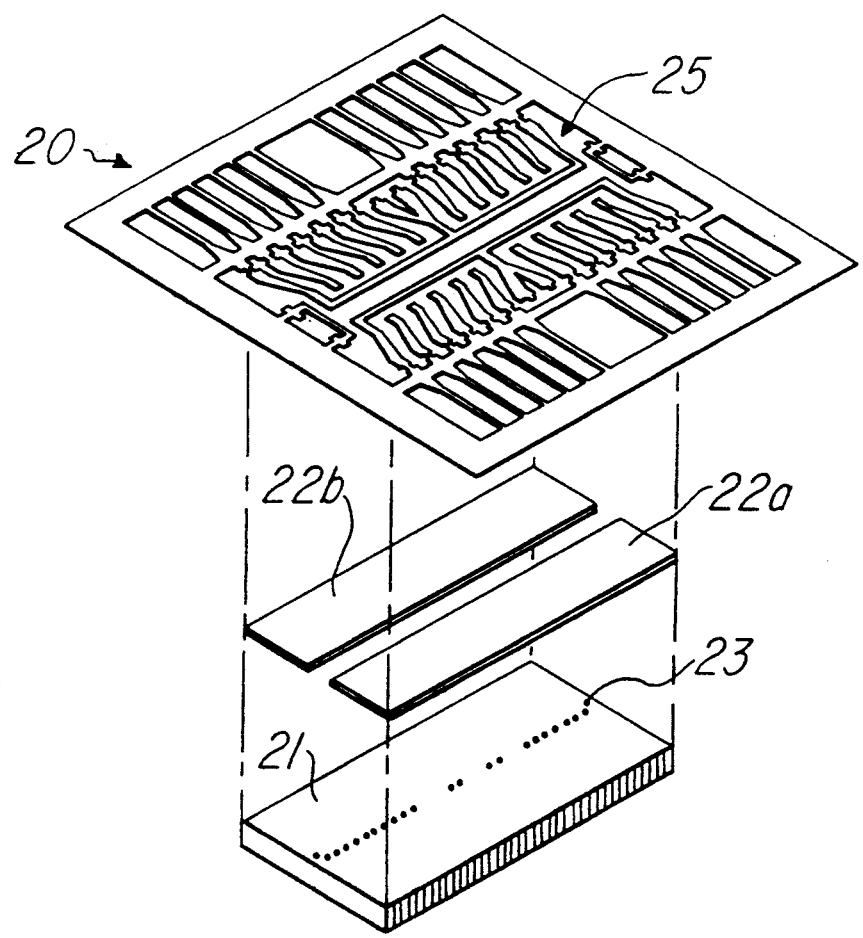
FIG. 2 is a perspective, exploded view of a lead on chip center bond device illustrating the lead frame, adhesive tape, and integrated circuit.

FIG. 2 illustrates an initial stage of the LOC concept. The following copending and coassigned applications also describe the LOC concept:

| Ser. No. | Inventor | Filed | TI-Docket |
| --- | --- | --- | --- |
| 373,742 | Heinen, et al. | 06/30/89 | 14287 |
| 455,210 | Lim, et al. | 12/22/89 | 14600 |
| 455,105 | Lim, et al. | 12/22/89 | 14603 |

In packaged device 20 of FIG. 2, the bond pads 23 lie along the central horizontal axis of semiconductor integrated circuit chip 21. Semiconductor 21 lies beneath lead on chip lead frame 25. Lead on chip lead frame 25 may be formed of conductive metal. An example is full hard temper CDA alloy 151 about 0.008 inches thick that may be spot plated in gold, silver, or the like. Another example is half hard alloy 42. Semiconductor chip 21 may be, for example, a 16 Megabit Dynamic Random Access Memory (DRAM) storing more than 16 million data bits on a semiconductor substrate about 325×660 mils. Two pieces of double sided adhesive tape 22a and 22b are disposed over the top active surface of semiconductor circuit 21 and attach lead frame 25 over the top of chip 21. It is this configuration that leads to the description "lead on chip", (LOC). The centrally disposed bond pads 23 lead to the further description "lead on chip center bond", (LOCCB). Double sided adhesive tape 22a and 22b may comprise, for example, a double sided thermosetting epoxy adhesive coated polyimide film that also acts as an active barrier. One such commercially available tape containing a polyimide film is sold under the trade name Dupont Kapton. The chip 21 and the lead frame 25 form a self supporting structure. No chip support pad is required.

Figure 2A:
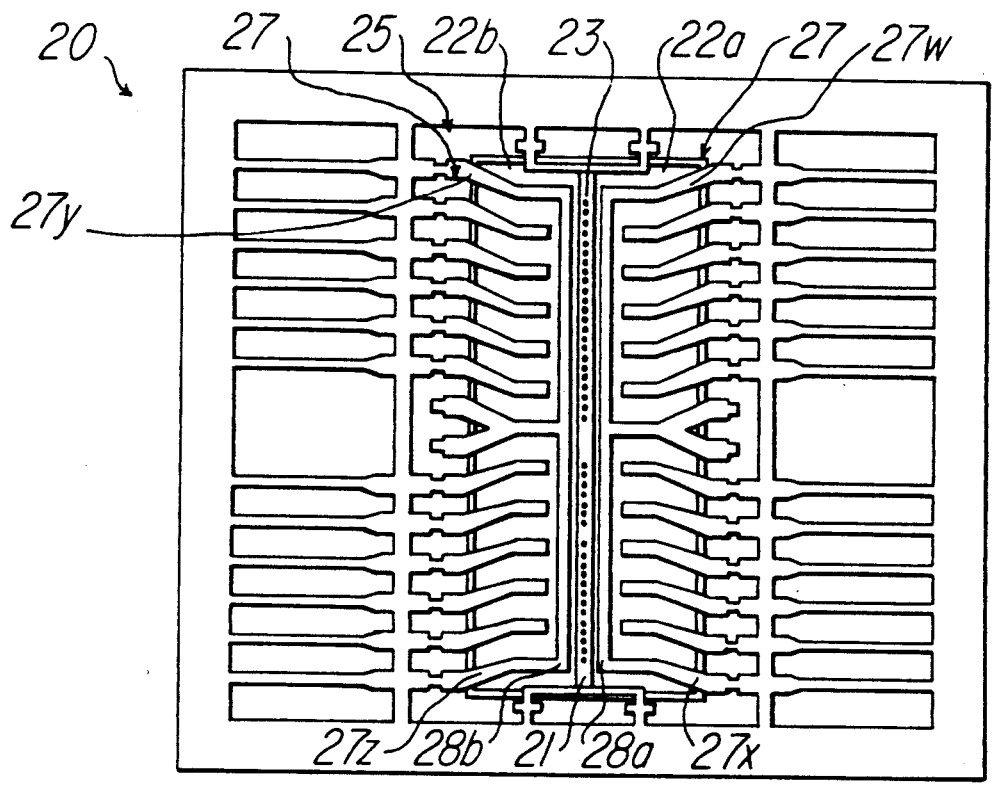
FIG. 2a is a top view of the lead on chip center bond device illustrating the connection of the integrated circuit chip thereunder.

FIG. 2a depicts the resulting structure when the lead frame 25 is affixed over the integrated circuit 21 in the manner shown in FIG. 2. The power busses 28a and 28b are part of the lead frame material and comprise spaced apart parallel conductive busses that run along the middle of the chip 21. Power supply bus 28a is connected between lead fingers 27w and 27x and may provide, for example, ground voltage Vss. Power supply bus 28b is connected between lead fingers 27y and 27z and may provide, for example, positive voltage Vdd. The adhesive tapes 22a and 22b are spaced apart such that the bond pads 23 of chip 21 are exposed for bonding to the conductive lead fingers 27 of lead frame 25.

Figure 2B:
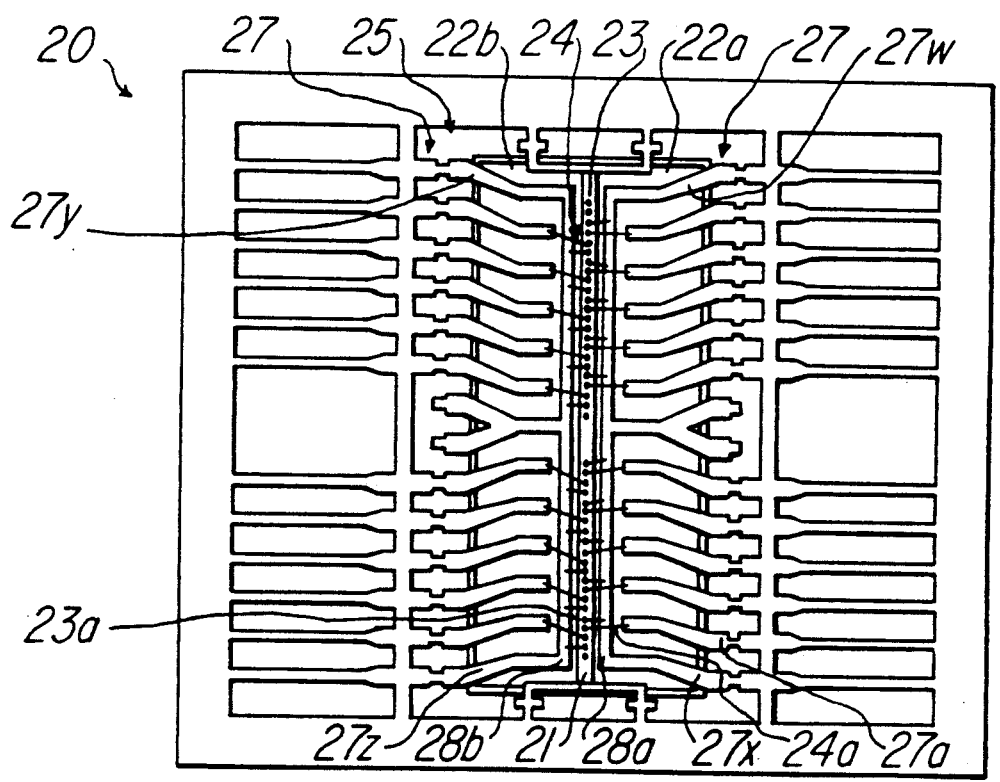
FIG. 2b is a top view of the lead on chip center bond device illustrating the connecting wire bonds.

FIG. 2b illustrates a subsequent assembly stage of packaged device 20 wherein high speed thermosonic gold ball wire bonding is accomplished to connect the bond pads 23 to various lead fingers 27 and to the power supply busses 28a and 28b. While various types of wire bonding may be utilized, gold wire bonds of about 0.001 inches diameter are sufficient. One end of the wire bonds 24 are connected to various of the bond pads 23. The other end of various wire bonds 24 are connected to the two centrally disposed power supply busses 28a and 28b of lead frame 25. Multiple wire bond contacts may be made to these busses to more efficiently distribute voltage. The other end of various wire bonds 24 cross over a power supply bus to make contact with the internal tip ends of the conductive lead fingers 27. Wire bond 24a is exemplary. One end of wire bond 24a is attached to the internal tip end of lead finger 27a. Wire bond 24a passes over power supply bus 28a where the other end of wire bond 24a is connected to bond pad 23a. The internal tip ends of the lead fingers 27 are downset. An undesirable wire sweep could result in wire bond 24a touching power supply bus 28a thereby causing an undesirable short.

Figure 2C:
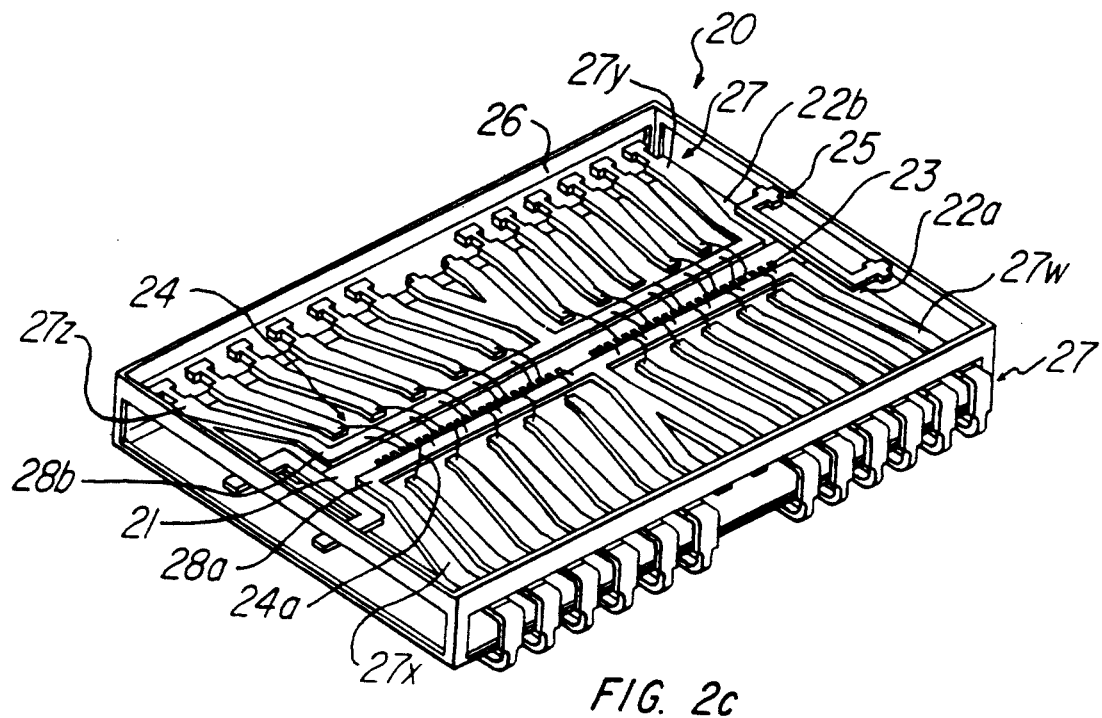
FIG. 2c is a top view of the lead on chip center bond device wherein the encapsulating mold compound is rendered transparent.

FIG. 2c illustrates packaged device 20 in a subsequent assembly stage with the plastic encapsulant 26 rendered transparent. Transfer molding is accomplished using a molding compound such as a Novolac epoxy. Low stress mold techniques work well in encapsulating the device. The plastic encapsulant 26 surrounds the integrated circuit 21, the lead frame 25, and the wire bonds 24 to form a plastic body. The lead frame 25 is trimmed and the lead fingers 27 are bent in the "J" shape with the outer lead finger ends extending through the plastic encapsulant 26 so that suitable physical and electrical connection may be made with external circuitry. There are 24 lead fingers 27 extending through the plastic encapsulant.

Figure 2D:
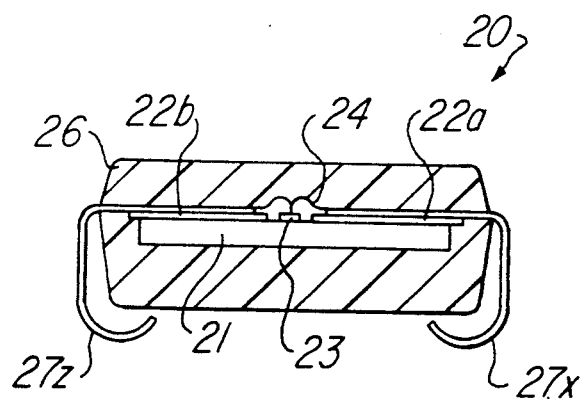
FIG. 2d is a side view of the completed lead on chip center bond package.

FIG. 2d is a side view of the completed lead on chip packaged device 20. The package size for the die size above described may be on the order of about 400×725 mils and may be thinner than about 50 mils. The external appearance of the package is that of a 24 pin PSOJ.

Figure 2E:
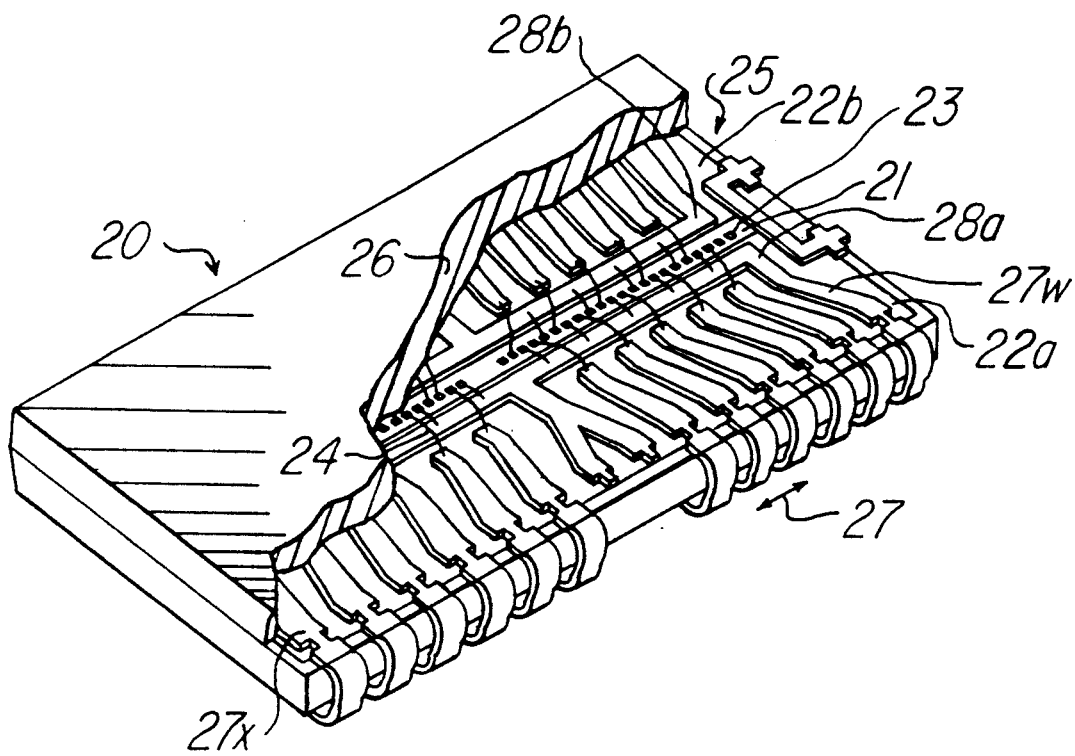
FIG. 2e is a perspective view, partially broken away, of the completed lead on chip center bond integrated circuit package.

FIG. 2e illustrates in perspective a partially cut away view of the finished semiconductor packaged device package 20.

Figure 3:
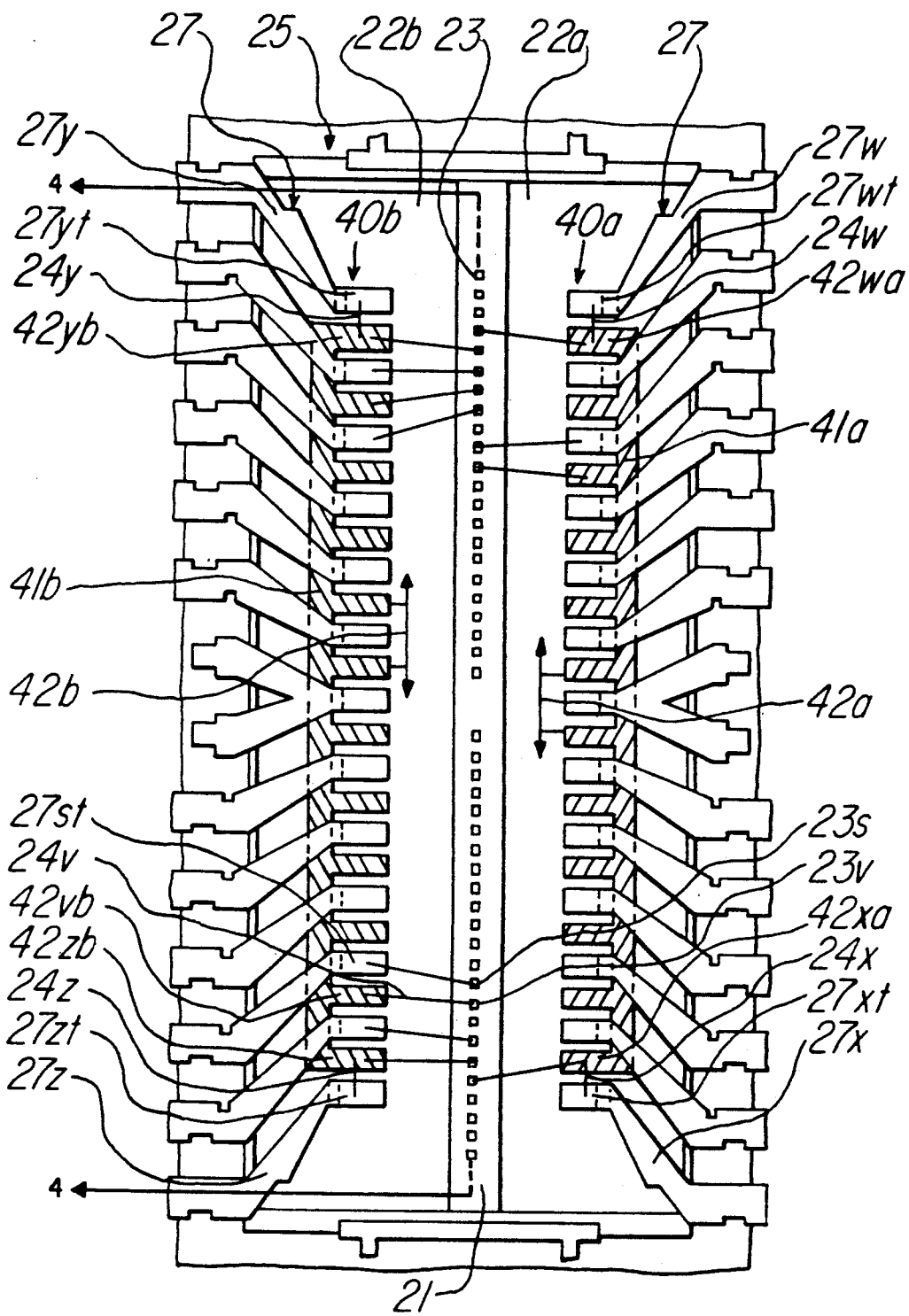
FIG. 3 is partial broken away top view of FIG. 2b, altered to illustrate the preferred embodiment of the invention.
Figure 4:
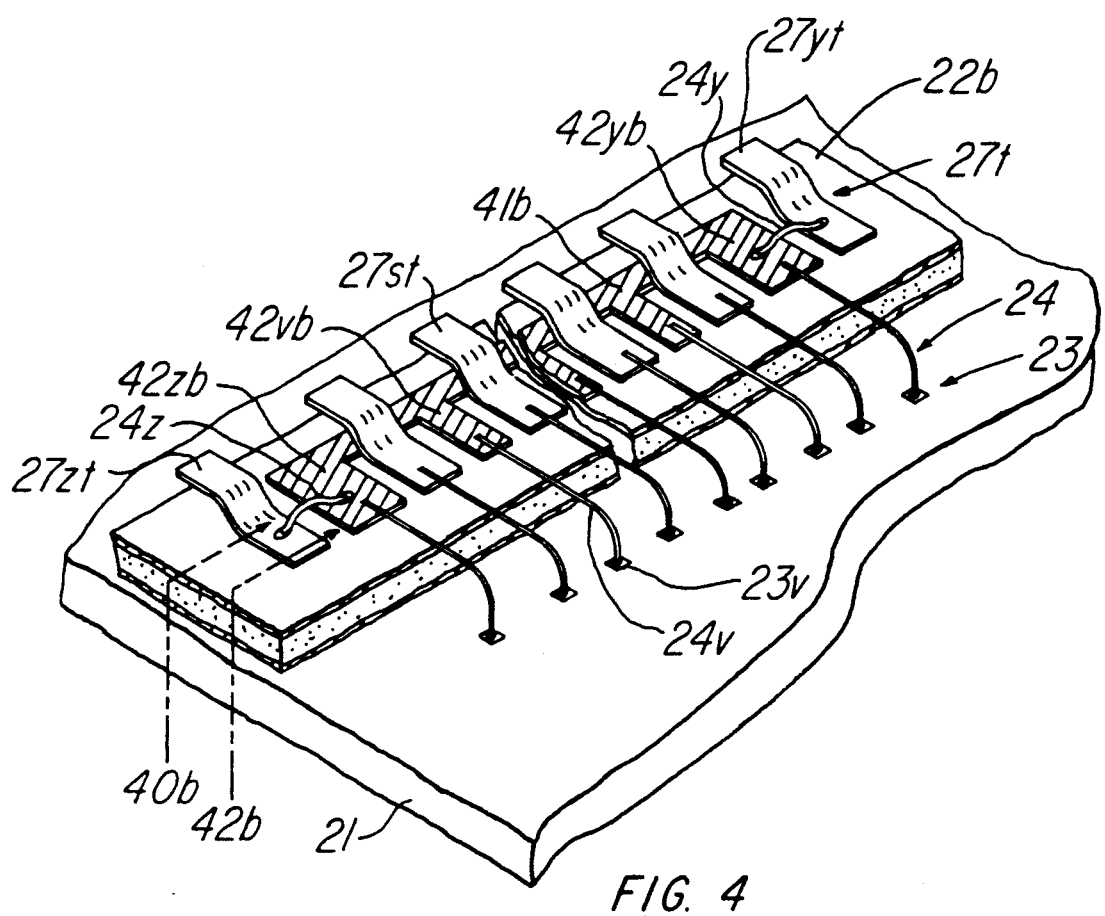
FIG. 4 is a partial perspective view of the preferred embodiment of the invention taken along the line 4—4 of FIG. 3

FIG. 3 is a partial broken away top view of FIG. 2b, altered to illustrate the preferred embodiment of the invention, while FIG. 4 is a perspective view along the line 4—4 of FIG. 3 to further illustrate the preferred embodiment of the invention. (The lead frame 25 is broken away from its outer edges and for clarity, only a few wire bonds are illustrated.) In FIGS. 3 and 4 the lead frame power supply busses 28a and 28b are eliminated. They are replaced respectively by comb inserts 40a and 40b that conduct power. Comb insert 40a supplies Vss while comb insert 40b supplies Vdd.

Referring to FIGS. 3 and 4, comb insert 40b is constructed out of conductive metal so that it conducts power. In the preferred embodiment, it is constructed out of the same metal as lead frame 25, half hard alloy 42, and is the same thickness as lead frame 25, approximately 0.008 inches thick. It may be spot plated in gold, silver, or the like. Other metal compositions suitable to conduct power will suffice, such as copper and full hard temper CDA alloy 151. Comb insert 40b has a comb base 41b and comb teeth 42b. The comb base 41b resides underneath the lead fingers 27. In the preferred embodiment, it is about the same width as the internal tip ends 27t, approximately 0.015 inches wide. It does not touch the downset internal tip ends 27t of the lead fingers 27; no shorting occurs. The comb teeth 42b reside between the internal tip ends of lead fingers 27. They are about the same width as the internal tip ends 27t of the lead fingers 27. They extend from the base 41b in alignment with the internal tip ends 27t. One side of double sided adhesive tape 22b adheres to the underside of comb insert 40b and holds it in place.

Referring to FIGS. 3 and 4, comb insert 40b is connected between lead fingers 27y and 27z. Wire bond 24z connects the inner tip portion 27zt of lead finger 27t to comb tooth 42zb. Wire bond 24y connects the inner tip portion 27yt of lead finger 27y to comb tooth 42yb. The outer end portions of lead fingers 27y and 27z, not illustrated, will extend through the encapsulated package for connecting to external Vdd. In this fashion, comb insert 40b provides external Vdd to those bonding pads connected to it by other wire bonds 24. For example, wire bond 24v connects bond pad 23v to comb tooth 42vb. Other bonding pads are directly wire bonded to their respective lead fingers as in FIGS. 2 et al. The bond pad 24s connection to lead finger tip 27st is one example.

Comb insert 42a of FIG. 3 is constructed the same as comb insert 42b and is similarly connected between lead fingers 27w and 27x so that it carries Vss.

Thus, the conductive comb insert is useful in lead on chip integrated circuit packages to function as a power supply bus by transferring power to the semiconductor die. A base, formed out of a conductive material, resides underneath the lead fingers of the semiconductor packaged device, electrically isolated from the lead fingers. The base has teeth extending from it, also formed out of the conductive material, that reside between the lead fingers of the semiconductor packaged device. Some of the teeth are electrically connected to the lead fingers for receiving external power. Some of the teeth are electrically connected to the bonding pads of the semiconductor die. Power is transferred from the lead fingers for receiving it, through the teeth electrically connected to these lead fingers, through the comb base, through the teeth electrically connected to the bonding pads, and to the semiconductor die. Wire bond shorting to the power supply bus portions of the conventional lead on chip lead frame is eliminated.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A conductive comb for a semiconductor packaged device, comprising:
    a base, formed out of a conductive material, residing underneath lead fingers and above an integrated circuit of the semiconductor packaged device, electrically isolated from the lead fingers, and dielectrically adhered to the integrated circuit; and
    teeth extending from the base, formed out of the conductive material, residing between the lead fingers of the semiconductor packaged device, approximately coplanar with the lead fingers at least one tooth electrically connected by means to a lead finger.

2. The conductive comb of claim 1 wherein the conductive material is metal sheet stock.

3. The conductive comb of claim 2 wherein the means for connecting the at least one tooth electrically connected to a lead finger is a wire bond.

4. The conductive comb of claim 3 further comprising:
    another tooth electrically connected to another lead finger by a wire bond.

5. The conductive comb of claim 4 wherein
    wherein the lead finger and the another lead finger are for transferring power from an external power source to the semiconductor packaged device, the conductive comb thereby also transferring power.

6. A semiconductor packaged device, comprising:
    a semiconductor chip having a major surface with bonding pads thereon disposed within an encapsulating material;
    a lead frame having a first side of adjacent lead fingers and a second side of adjacent lead fingers, the first side of adjacent lead fingers and the second side of adjacent lead fingers having outer ends extending through the encapsulating material and having downset inner tips overlying the major surface of the semiconductor chip for connecting to the bonding pads of the semiconductor chip; and
    a conductive comb disposed above the major surface of the semiconductor chip having comb teeth lying between the downset inner tips of the lead fingers of the first side of adjacent lead fingers, having two comb teeth electrically connected to the downset inner tips of two different lead fingers of the first side of adjacent lead fingers.

7. The semiconductor packaged device of claim 6 further comprising:
    a double sided adhesive tape, having one side adhered to the major surface of the semiconductor chip, the other side adhered to the downset inner tips of the first side of adjacent lead fingers and adhered to the conductive comb.

8. The semiconductor packaged device of claim 7 wherein the two comb teeth electrically connected to downset tips of two different lead fingers of the first side of adjacent lead fingers are electrically connected by wire bonds.

9. The semiconductor packaged device of claim 8 wherein the external ends of the two different lead fingers are for connecting the semiconductor packaged device to a power supply source.

10. The semiconductor packaged device of claim 9 further comprising:
    a second conductive comb having comb teeth lying between the lead fingers of the second side of adjacent lead fingers, having two comb teeth electrically connected to the downset inner tips of two different lead fingers of the second side of adjacent lead fingers.

11. The semiconductor packaged device of claim 10 wherein the semiconductor chip is a semiconductor memory device.

12. The semiconductor packaged device of claim 10 wherein the lead frame is a lead over chip lead frame.

13. A lead frame comprising:
    a plurality of lead fingers formed of metal sheet stock having tips for connecting to an integrated circuit;
    a power supply bus formed of a contiguous piece of metal sheet stock, having:
    a first metal portion under the lead fingers and transversely disposed to the tips of the plurality of lead fingers; and
    a plurality of second metal portions, coplanar with the tips of the plurality of lead fingers, extending from the first metal portion so that they are between and substantially parallel to the plurality of lead finger tips.

14. The lead frame of claim 13 wherein the first metal portion is transversely disposed coplanar with the tips of the plurality of lead fingers.

15. The lead frame of claim 14 wherein the power supply bus is connected to one of the plurality of lead fingers by a wire bond extending from the lead finger tip to one of the plurality of second metal portions.

* * * * *